(12) United States Patent
Chen et al.

(10) Patent No.: US 11,869,817 B2
(45) Date of Patent: Jan. 9, 2024

(54) VERTICAL LIGHT EMITTING DIODE CHIP PACKAGE WITH ELECTRICAL DETECTION POSITION

(71) Applicant: EXCELLENCE OPTO. INC., Miaoli County (TW)

(72) Inventors: Fu-Bang Chen, Miaoli County (TW); Chih-Chiang Chang, Miaoli County (TW); Chang-Ching Huang, Miaoli County (TW); Chun-Ming Lai, Miaoli County (TW); Wen-Hsing Huang, Miaoli County (TW); Tzeng-Guang Tsai, Miaoli County (TW); Kuo-Hsin Huang, Miaoli County (TW)

(73) Assignee: EXCELLENCE OPTO. INC., Hsinchu Science Park (TW)

( * ) Notice: Subject to any disclaimer, the term of this patent is extended or adjusted under 35 U.S.C. 154(b) by 254 days.

(21) Appl. No.: 17/385,139

(22) Filed: Jul. 26, 2021

(65) Prior Publication Data
US 2023/0023295 A1   Jan. 26, 2023

(51) Int. Cl.
*H01L 33/00* (2010.01)
*H01L 29/00* (2006.01)
(Continued)

(52) U.S. Cl.
CPC ............ *H01L 22/32* (2013.01); *H01L 25/167* (2013.01); *H01L 29/866* (2013.01); *H01L 33/42* (2013.01);
(Continued)

(58) Field of Classification Search
CPC ......... H01L 33/64; H01L 33/62; H01L 33/66; H01L 33/486; H01L 29/866; H01L 22/32; H01L 22/34; H01L 33/36–42; H01L 25/167; H01L 2933/0066; H01L 2933/0016
See application file for complete search history.

(56) References Cited

U.S. PATENT DOCUMENTS

2009/0189166 A1* 7/2009 Lee .................. H01L 27/153
257/101

FOREIGN PATENT DOCUMENTS

CN         109192719 A  *  1/2019  ............. H01L 22/34

* cited by examiner

*Primary Examiner* — Walter H Swanson
*Assistant Examiner* — Jacob T Nelson
(74) *Attorney, Agent, or Firm* — MUNCY, GEISSLER, OLDS & LOWE, P.C.

(57) ABSTRACT

The invention comprises a light emitting diode chip and a package substrate. The light emitting diode chip is provided with a semiconductor epitaxial structure, a lateral extending interface structure, a chip conductive structure, an N-type electrode located above the semiconductor epitaxial structure and a P-type bypass detection electrode located on the lateral extending interface structure. The chip conductive structure is provided with a P-type main electrode located on a lower side. The package substrate comprises a plurality of electrode contacts through which the N-type electrode, the P-type bypass detection electrode and the P-type main electrode are connected, and a process quality of a alternative substrate adhesive layer in one of the semiconductor epitaxial structure and the chip conductive structure and a chip-substrate bonding adhesive layer between the P-type main electrode and the package substrate is evaluated by detecting electrical characteristics.

15 Claims, 10 Drawing Sheets

(51) Int. Cl.
*H01L 21/66* (2006.01)
*H01L 25/16* (2023.01)
*H01L 29/866* (2006.01)
*H01L 33/64* (2010.01)
*H01L 33/52* (2010.01)
*H01L 33/62* (2010.01)
*H01L 33/42* (2010.01)

(52) U.S. Cl.
CPC .............. *H01L 33/52* (2013.01); *H01L 33/62* (2013.01); *H01L 33/64* (2013.01)

VERTICAL LIGHT EMITTING DIODE CHIP PACKAGE WITH ELECTRICAL DETECTION POSITION

FIELD OF THE INVENTION

The present invention relates to a light emitting diode chip structure, and in particular, to a vertical light emitting diode chip with an electrical detection point and a corresponding package.

BACKGROUND OF THE INVENTION

A light emitting diode (LED) is a light source generating high brightness by recombining electrons and holes of a semiconductor. The product could be used for high-luminosity sterilization (ultraviolet light), automobile head lamps and tail lamps (blue, yellow, and red light), projector light sources (blue, green, and red), and infrared security detection (infrared ray). An outstanding high-power LED element also needs good reliability, in addition to high luminosity and luminous density. Taking an automobile head lamp module as an example, once the LED fails, night safety would be affected. According to a high standard specification of the automobile LED, improvement is required in an automobile industry even if only one fail LED in a million; therefore, the accurate photoelectric characteristic detection of the element is very important.

Figure 1:
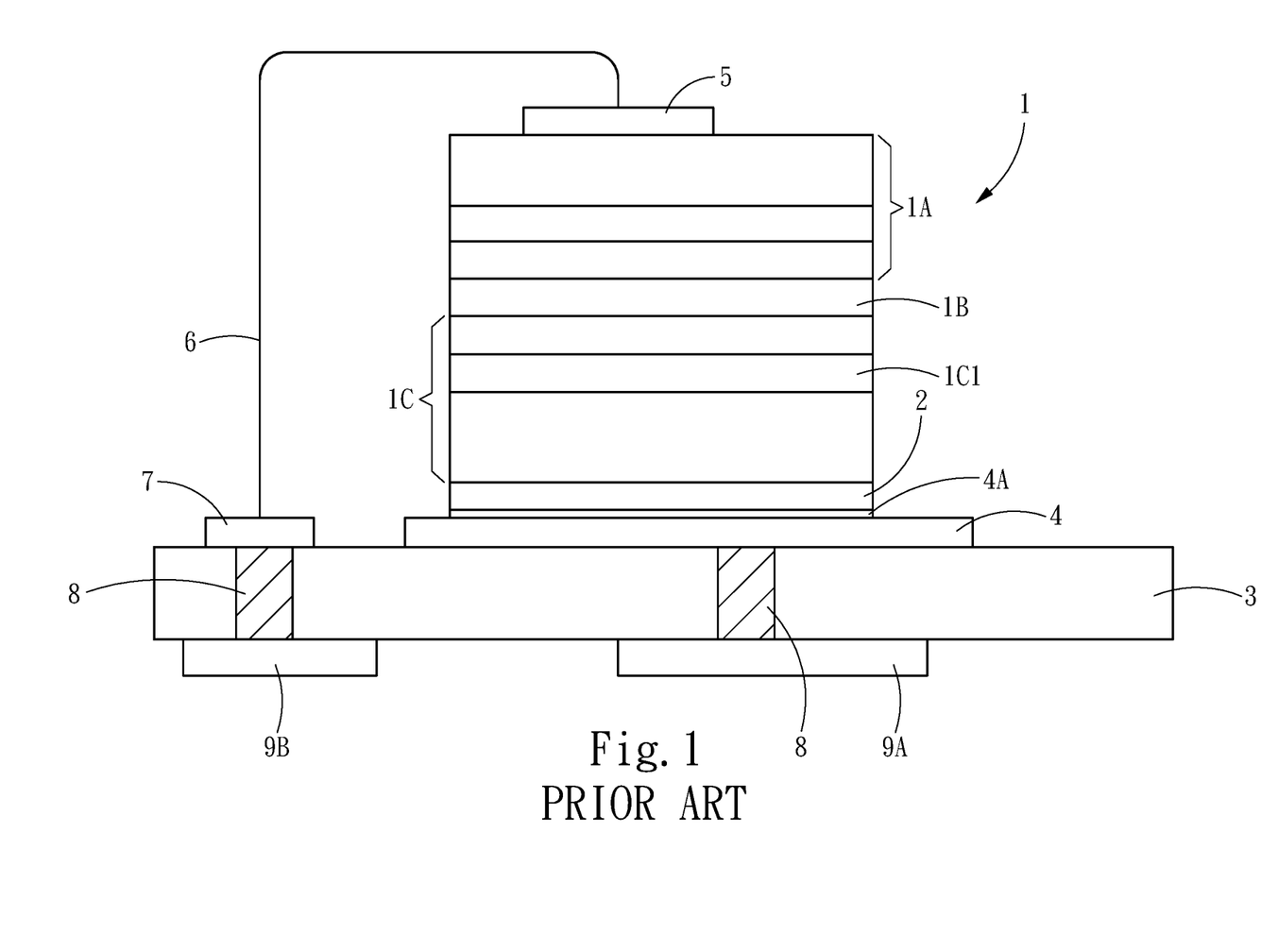
FIG. 1 is a cross section of a light emitting diode package structure of the an art.

As shown in FIG. 1, in one embodiment, when a vertical LED chip 1 is packaged in an SMD, a P-type electrode 2 is bonded to a chip bonding conductive layer 4 of a package substrate 3 through a chip-substrate bonding adhesive layer 4A. An N-type electrode 5 is electrically connected to a wire bonding pad 7 by wire bonding of gold wire 6. The chip bonding conductive layer 4 and the wire bonding pad 7 are electrically connected to an anode 9A and a cathode 9B located at the other side of the package substrate 3 through a via metal 8.

For the vertical LED, the main structure of the vertical LED chip 1 includes a semiconductor epitaxial structure 1A, an interface structure 1B, and a chip conductive structure 1C from top to bottom.

The semiconductor epitaxial structure 1A includes an N-type semiconductor, a luminescent layer, and a P-type semiconductor from top to bottom. The chip conductive structure 1C includes a structural metal layer, a alternative substrate adhesive layer 1C1, and a high thermal conductive alternative substrate from top to bottom. The interface structure 1B is generally a structural metal layer that includes a partial or complete metal connected to the semiconductor epitaxial structure 1A of the P-type semiconductor and the chip conductive structure 1C of the structural metal layer in an Ohmic contact manner. The P-type electrode 2 is located below the high thermal conductive alternative substrate.

The chip conductive structure 1C mainly takes the lower high thermal conductive alternative substrate as a main support structure, and is bonded with the upper metal structure layer through the alternative substrate adhesive layer 1C1 in a chip process in a form of a wafer level. Generally, metal Eutectic bonding (such as AuSn Eutectic bonding) is used for metal bonding, which includes a problem of the yield for a flat lamination process. If a non-flat surface, holes, or pollution is formed in the bonding process due to low quality of raw materials or process, the impedance would be abnormally increased, causing that the chip forms non-uniform current under a high-current operation to result in a local hot spot, thus leading to the reduction in lighting effect and credibility.

In addition, the vertical LED chip 1 and the package substrate 3 need a chip-substrate bonding adhesive layer 4A to achieve the conductive bonding (generally, the Eutectic bonding is used for conductive bonding of metal solid crystal). If the bottom of the vertical LED chip 1 is not flat and pollutes with bonded particle, the resistance of the bottom junction under the high-current operation would also increase, forming the local hot spot, thus leading to element burn-out.

Finally, the anode 9A and the cathode 9B are used as a test contact for detecting in conjunction with a test instrument to measure the photoelectricity of elements in the vertical LED package in order to meet the high standard specification of the automobile LED.

However, when detecting the vertical LED chip 1, the electrical characteristics (high Vf) of the abnormally high voltage are the overall electrical characteristics of the semiconductor epitaxial structure 1A, the interface structure 1B, and the chip conductive structure 1C. It could not be determined whether the abnormal source is the semiconductor epitaxial structure 1A, or the alternative substrate adhesive layer 1C1 and the chip-substrate bonding adhesive layer 4A of the chip conductive structure 1C.

Furthermore, the characteristics of the diode of the semiconductor layer are a trace voltage and current, wherein tiny electrical characteristics of forward biased voltage and reverse biased voltage of the chip conductive structure 1C are unable to be accurately measured due to the noise impact thereof, causing difficulty in judgment of epitaxial quality.

SUMMARY OF THE INVENTION

The invention mainly aims to provide a vertical light emitting diode chip package with a plurality of electrical test contacts, which provides accurate electrical characteristic test of all layers among a semiconductor epitaxial structure, an interface structure, a chip conductive structure, and a package substrate.

The invention is a vertical light emitting diode chip package with an electrical detection position, comprising a light emitting diode chip and a package substrate, wherein the light emitting diode chip is provided with a chip conductive structure, a lateral extending interface structure, a semiconductor epitaxial structure, an N-type electrode and a P-type bypass detection electrode. The chip conductive structure is provided with a P-type main electrode located on a lower side, and the P-type main electrode is electrically connected with the package substrate in a plane chip bonding conductive way. The lateral extending interface structure of the invention includes a high-concentration P-type semiconductor layer, an Ohmic contact layer, and a high conductive metal layer which are stacked successively. The lateral extending interface structure is arranged at one side, away from the P-type electrode, of the chip conductive structure, and the semiconductor epitaxial structure and the P-type bypass detection electrode are respectively arranged on an upper plane of the lateral extending interface structure. The semiconductor epitaxial structure and the chip conductive structure achieve the Ohmic contact by virtue of the lateral extending interface structure.

The N-type electrode is arranged at one side, away from the chip conductive structure, of the semiconductor epitaxial structure. The chip conductive structure of the invention further includes a structural metal layer, an alternative substrate adhesive layer, and a high thermal conductive alternative substrate, wherein the structural metal layer is located below the lateral extending interface structure, the high thermal conductive alternative substrate is bonded with the substitute bonding layer below the structural metal layer, and the P-type main electrode is arranged below the high thermal conductive alternative substrate. The high conductive metal layer at the bottom of the lateral extending interface structure should be the material that has stable chemical properties and is conductive to the Ohmic contact, and thus can be connected to the structural metal layer at the top of the chip conductive structure. The structural metal layer should be the material that has stable chemical properties and is conductive to subsequent Eutectic bonding.

The high thermal conductive alternative substrate is located in the chip conducting substrate structure and is a main structure support layer. The high thermal conductive alternative substrate is connected to the structural metal layer including the semiconductor epitaxial structure by virtue of the alternative substrate adhesive layer in a metal Eutectic bonding manner. The P-type main electrode is located below the high thermal conductive alternative substrate.

The package substrate is provided with an upper plane and a lower plane located at both sides, wherein an anode and a cathode are arranged on the lower plane. A main first electrode, a main second electrode, a main third electrode, a first electrical test contact, a second electrical test contact, and a third electrical test contact are arranged on the upper plane. The N-type electrode is electrically connected with the main first electrode by a first chip bonding wire, the P-type bypass detection electrode is electrically connected with the main second electrode by a second chip bonding wire. The P-type main electrode is electrically connected by bonding with the main third electrode through a chip-substrate bonding adhesive layer. The first electrical test contact is electrically connected with the main first electrode and the cathode, the second electrical test contact is electrically connected with the main second electrode, and the third electrical test contact is electrically connected with the main third electrode and the anode.

The first electrical test contact is electrically connected with the N-type electrode through the main first electrode, the second electrical test contact is electrically connected with the P-type bypass detection electrode through the main second electrode, and the electrical characteristics of the N-type electrode of the P-type bypass detection electrode are the electrical characteristics of the semiconductor epitaxial structure and the lateral extending interface structure.

Therefore, the first electrical test contact and the second electrical test contact are detected to obtain the electrical characteristics of the semiconductor epitaxial structure and the lateral extending interface structure. Especially, the accurate value of trace electrical property of the forward biased voltage and the reverse biased voltage of the semiconductor epitaxial structure (the diode) are accurately measured, and the epitaxial process quality of the semiconductor epitaxial structure is evaluated more accurately.

Further, the third electrical test contact is electrically connected with the P-type main electrode through the main third electrode. Therefore, the second electrical test contact and the third electrical test contact are detected to obtain the electrical characteristics of the chip conductive structure and chip-substrate bonding adhesive layer which is between the P-type main electrode and the main third electrode, which evaluates the process quality of the alternative substrate adhesive layer and the chip-substrate bonding adhesive layer.

DETAILED DESCRIPTION OF THE PREFERRED EMBODIMENTS

In order to let committee have a deep understanding and acknowledge of the characteristics, purpose, and effect of the invention, a better embodiment is hereby illustrated and described in combination with figures as below.

Figure 2:
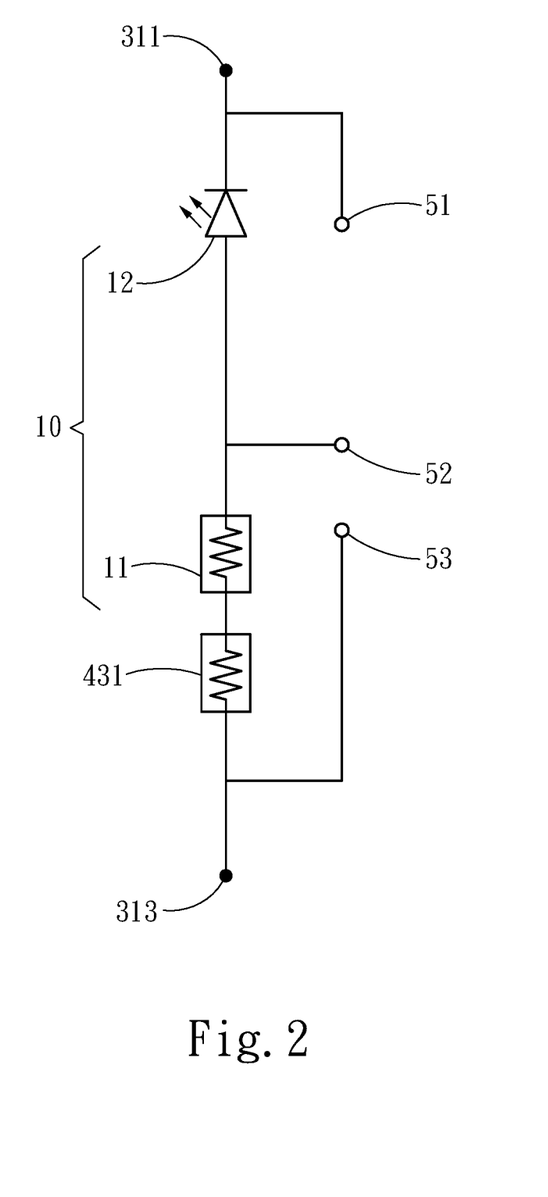
FIG. 2 is a circuit of a package structure in a first embodiment of the invention.
Figure 3:
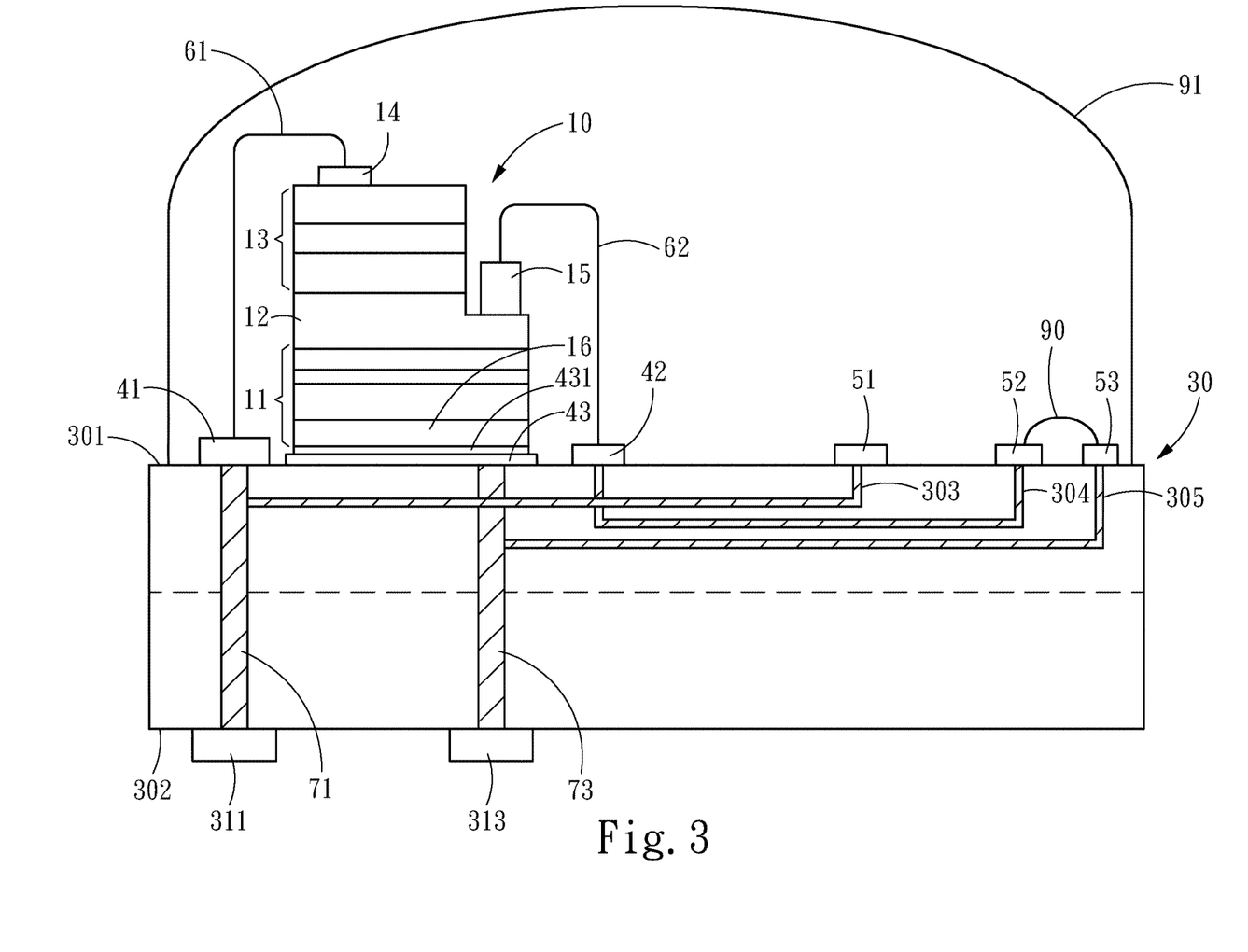
FIG. 3 is a cross section of a package structure in a first embodiment of the invention.

Please refer to FIG. 2 and FIG. 3, as the first embodiment, the invention comprises a light emitting diode chip 10 and a package substrate 30. The light emitting diode chip 10 is provided with a chip conductive structure 11, a lateral extending interface structure 12, a semiconductor epitaxial structure 13, an N-type electrode 14 and a P-type bypass detection electrode 15. The chip conductive structure 11 is provided with a P-type main electrode 16 located at a lower side, the lateral extending interface structure 12 is arranged at one side, away from the P-type electrode 16, of the chip conductive structure 11, the semiconductor epitaxial structure 13 and the P-type bypass detection electrode 15 are arranged on an upper plane of the lateral extending interface structure 12. The semiconductor epitaxial structure 13 and the chip conductive structure 11 achieve an Ohmic contact by virtue of the lateral extending interface structure 12. The N-type electrode 14 is arranged at one side, away from the chip conductive structure 11, of the semiconductor epitaxial structure 13.

The package substrate 30 is provided with an upper surface 301 and a lower surface 302 located at both sides, wherein an anode 313 and a cathode 311 are arranged on the lower surface 302. A main first electrode 41, a main second electrode 42, a main third electrode 43, a first electrical test contact 51, a second electrical test contact 52, and a third electrical test contact 53 are arranged on the upper surface 301. The N-type electrode 14 is electrically connected with the main first electrode 41 by a first chip bonding wire 61, the P-type bypass detection electrode 15 is electrically connected with the main second electrode 42 by a second chip bonding wire 62. The P-type main electrode 16 is electrically connected by directly bonding with the main third electrode 43 through a chip-substrate bonding adhesive layer 431 (a die attach adhesive or a metal). The first electrical test contact 51 is electrically connected with the main first electrode 41 and the cathode 311. The second electrical test contact 52 is electrically connected with the main second electrode 42. And the third electrical test contact 53 is electrically connected with the main third electrode 43 and the anode 313.

Figure 7:
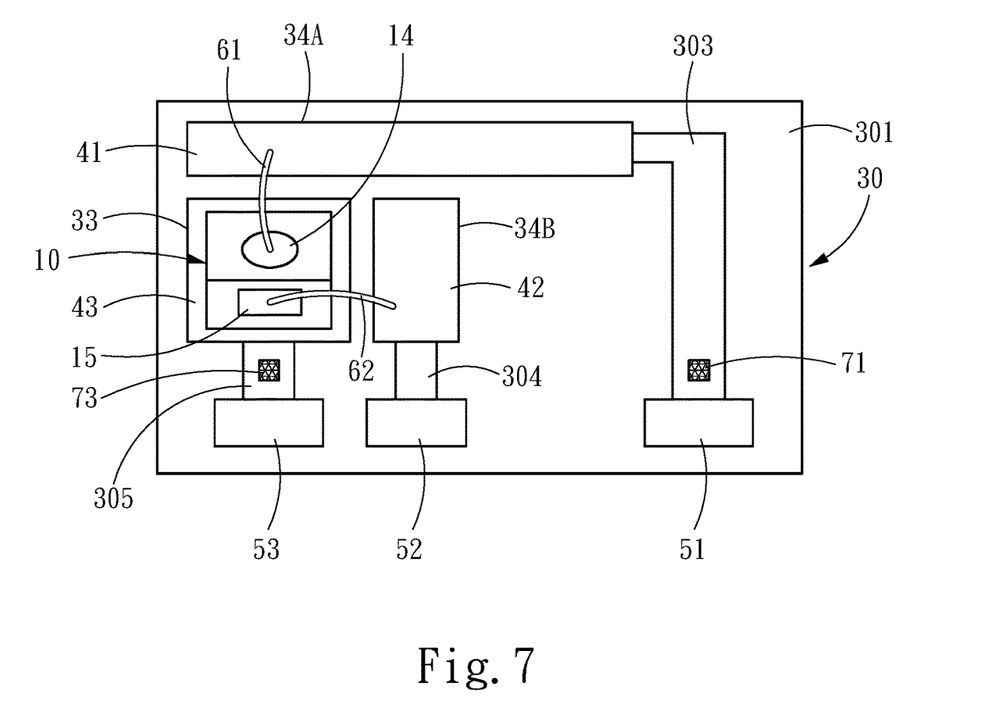
FIG. 7 is a top view of a package substrate in a first embodiment of the invention.

In terms of an actual structure, the package substrate 30 could be a ceramic substrate (aluminum nitride, aluminum oxide, and silicon carbide), a copper laminate, a Bismaleimide Triazine (BT) laminate, etc. and could be a single-layer plate or a multi-layer plate. The main first electrode 41 is electrically connected with the cathode 311 through a first via metal 71 of the package substrate penetrating through the package substrate 30, and the main third electrode 43 is electrically connected with the anode 313 through a second via metal 73 penetrating through the package substrate 30. In addition, the package substrate 30 could be of a multi-layer plate structure. The metal conductive layers 303, 304 and 305 (as drawn in FIG. 3) buried in the package substrate 30 are used to perform electrical connection between the first electrical test contact 51 and the main first electrode 41, between the second electrical test contact 52 and the main second electrode 42, and between the third electrical test contact 53 and the main third electrode 43. The metal conductive layers 303, 304 and 305 are also optional to be formed on the upper surface 301 (as shown in FIG. 7) of the package substrate 30.

Figure 4:
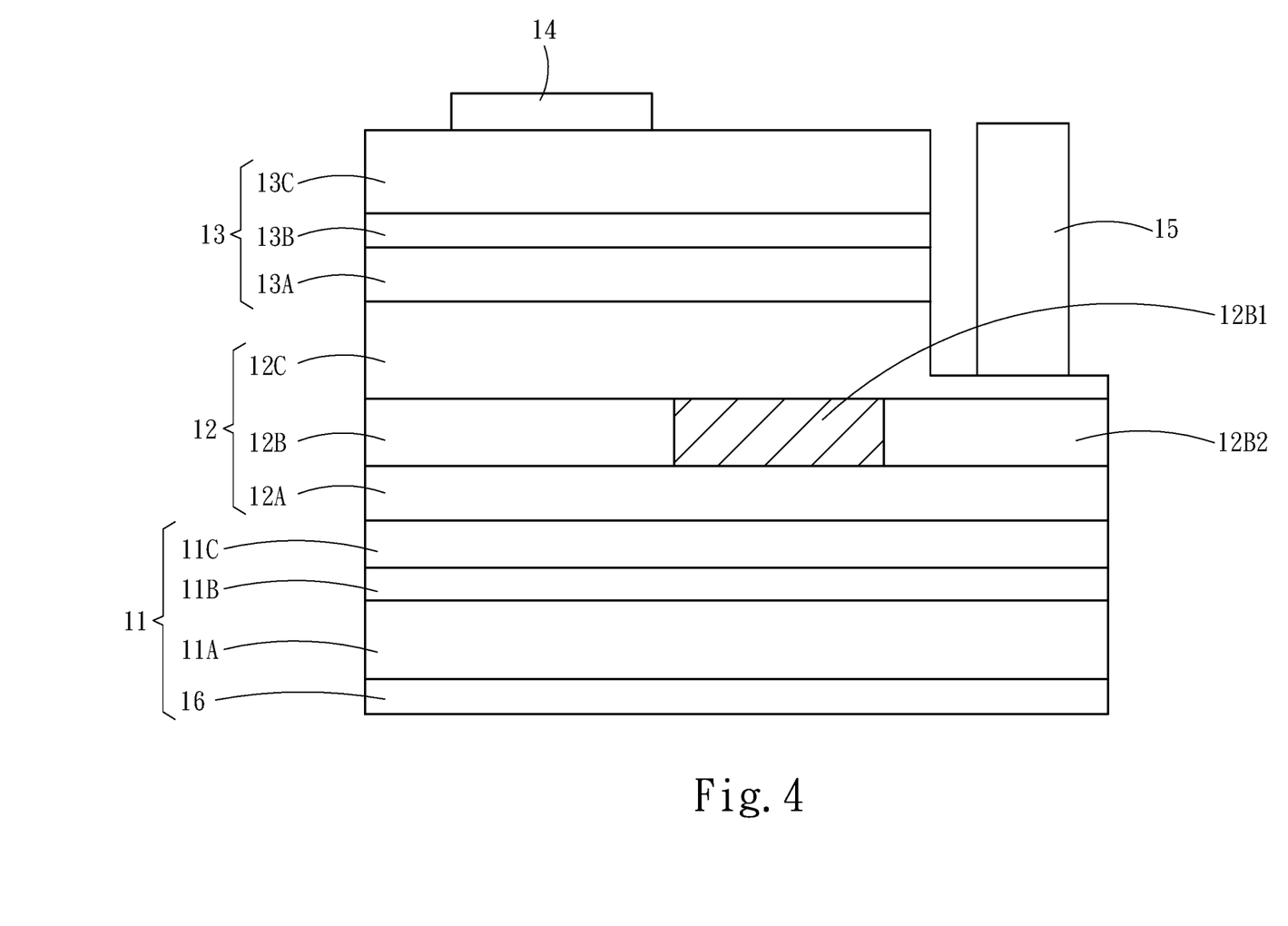
FIG. 4 is a cross section of a chip structure in an embodiment of the invention.

Please refer to FIG. 4, in an embodiment, the semiconductor epitaxial structure 13 comprises a P-type semiconductor 13A, an active layer 13B, and an N-type semiconductor 13C which are stacked successively, wherein the N-type electrode 14 is located on the N-type semiconductor 13C, and the chip conductive structure 11 is even provided with a high thermal conductive alternative substrate 11A, an alternative substrate adhesive layer 11B, and a structural metal layer 11C which are stacked successively. The P-type semiconductor 13A and the P-type bypass detection electrode 15 are located at different positions of the lateral extending interface structure 12. The lateral extending interface structure 12 comprises a high conductive metal layer 12A, an Ohmic contact layer 12B, and a high concentration P-type semiconductor conductive layer 12C which are stacked successively. The P-type bypass detection electrode 15 is located at an outer side of an edge of the lateral extending interface structure 12. The high conductive metal layer 12A is located above the structural metal layer 11C. The P-type semiconductor 13A and the P-type bypass detection electrode 15 are located on the high concentration P-type semiconductor conductive layer 12C. In the embodiment, especially for a quaternary (aluminum, gallium, indium and phosphorus) LED, the high concentration P-type semiconductor conductive layer 12C could be p-GaP. The Ohmic contact layer 12B could be the Ohmic contact metal 12B1 matched with a transparent material 12B2. The Ohmic contact metal 12B1 includes upper and lower layers of a contact connection of a plurality of columnar (BeAu columnar) structures (a slash box as shown in FIG. 4), wherein the Ohmic contact metal 12B1 is an Ohmic contact conducting block, and the high conductive metal layer 12A is Ag/TiW/Pt.

Figure 5:
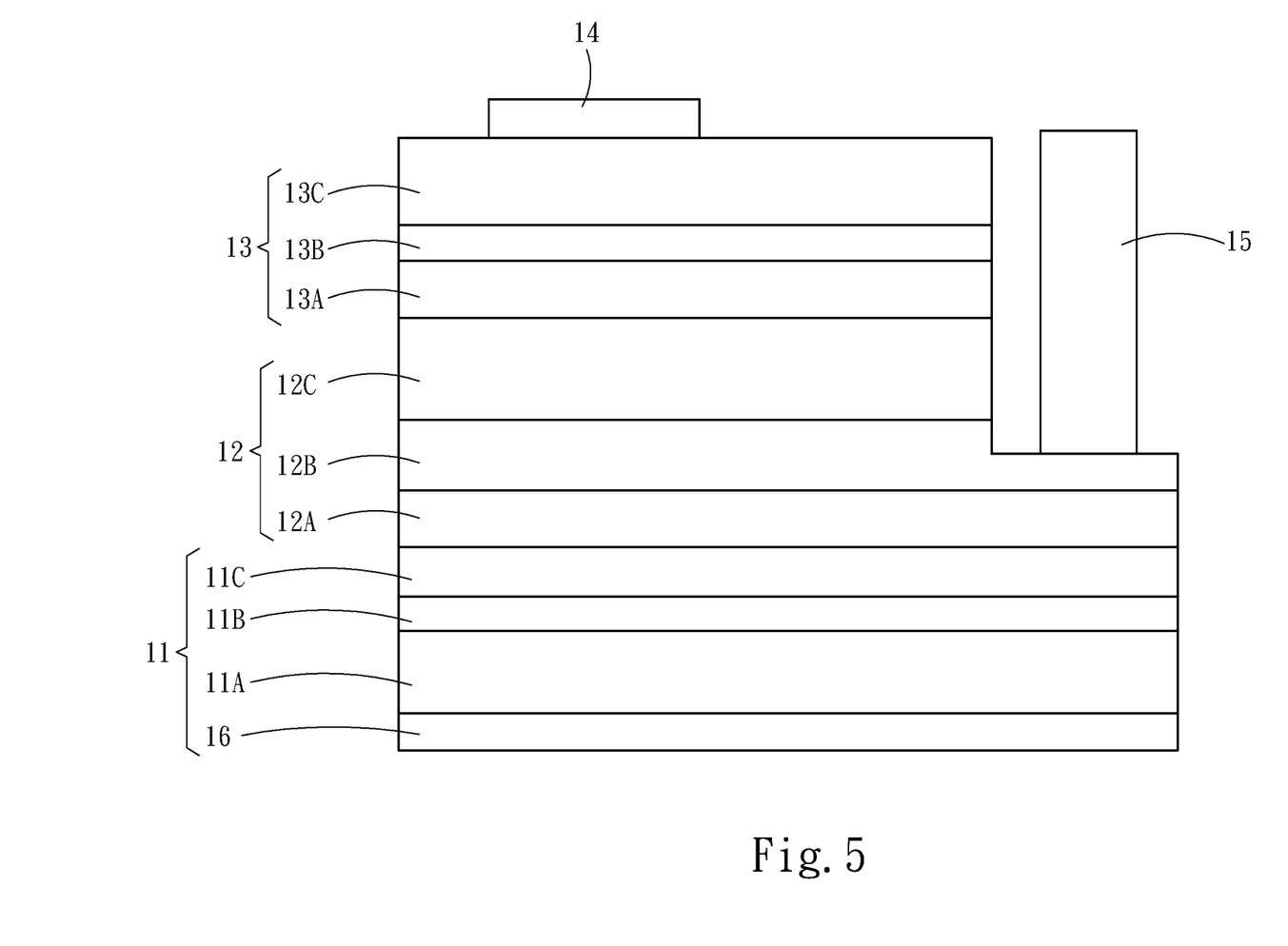
FIG. 5 is a cross section of a chip structure in another embodiment of the invention.

Please refer to FIG. 5, in another embodiment, the P-type bypass detection electrode 15 could also be located on the Ohmic contact layer 12B. The structure is usually used for nitride blue LED (aluminum, gallium, indium and nitrogen). The high concentration P-type (P$^+$-type) semiconductor conductive layer 12C could be p-GaN or p-InGaN, wherein the Ohmic contact layer 12B is ITO, and the high conductive metal layer 12A is Ag and TiW.

Figure 6:
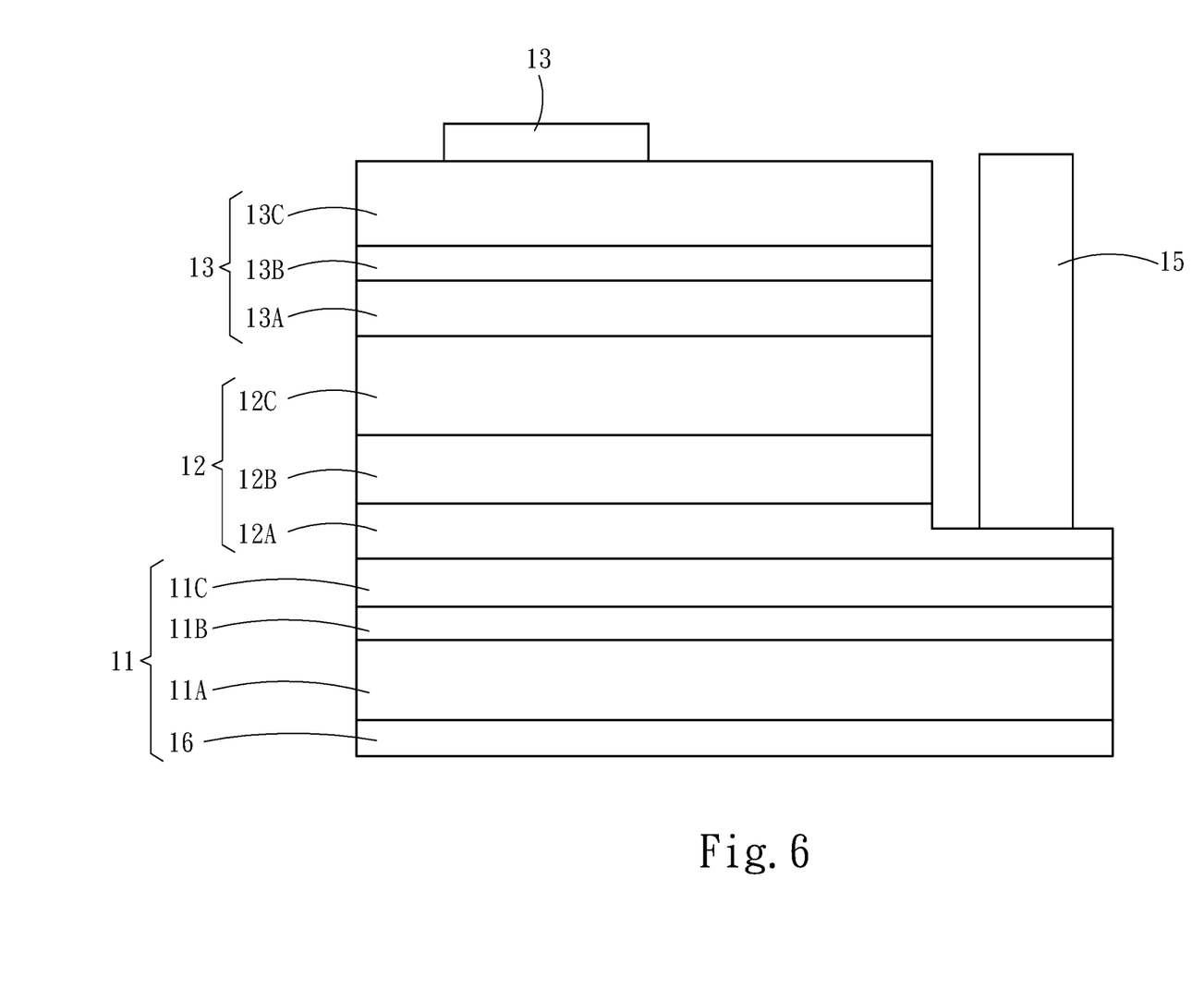
FIG. 6 is a cross section of a chip structure in another embodiment of the invention.

Please refer to FIG. 6, in another embodiment, the P-type bypass detection electrode 15 can also be located on the high conductive metal layer 12A. The structure is usually used for nitride blue LED. The high concentration P-type semiconductor conductive layer 12C could be p-GaN or p-InGaN, wherein the Ohmic contact layer 12B is Ag, and the high conductive metal layer 12A is TiW or Pt or a mixture thereof.

The vertical light emitting diode chip 1 with the electrical detection of the P-type bypass detection electrode 15, and the package substrate 30 with the detection position are designed as follows. Please refer to FIG. 7, the upper surface 301 of the package substrate 30 could be provided with a chip bonding pad 33 to be used as the main third electrode 43. A P-type main electrode 16 (not shown in FIG. 7) of the light emitting diode chip 10 is located on the chip bonding pad 33, the N-type electrode is electrically connected with the main first electrode 41 through the first chip bonding wire 61, and the P-type bypass detection electrode is electrically connected with the main second electrode 42 through the second chip bonding wire 62. The upper surface 301 of the package substrate 30 could also be provided with two different wire bonding pads 34A and 34B, and the two different wire bonding pads 34A and 34B are respectively used as the main first electrode 41 and the main second electrode 42.

Figure 8:
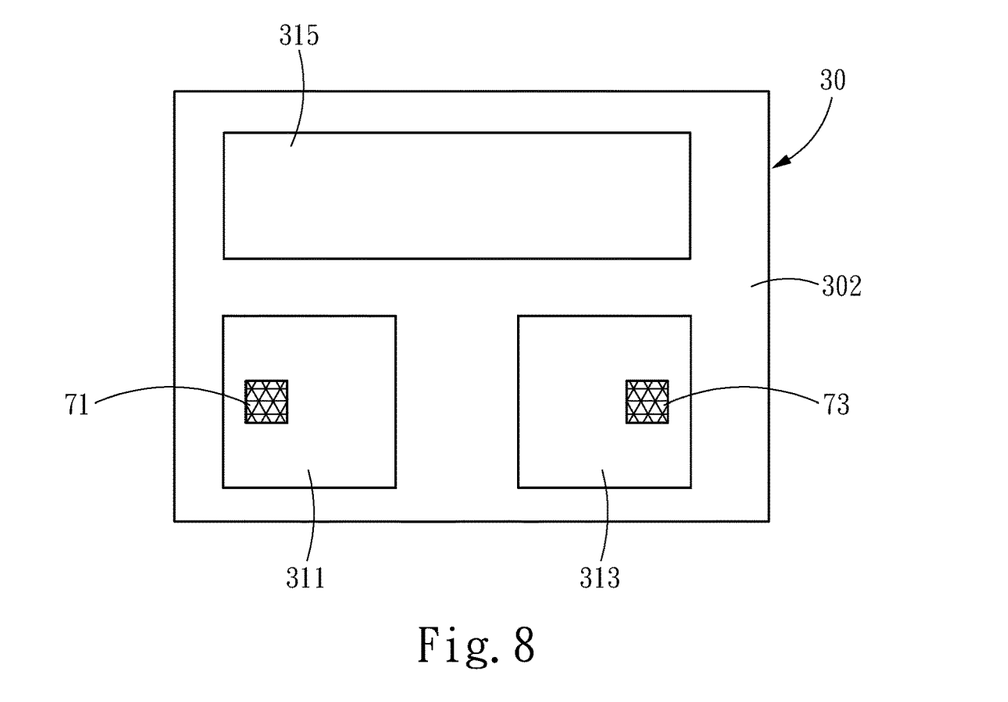
FIG. 8 is a bottom view of a package substrate in a first embodiment of the invention.

Please refer to FIG. 8, the lower surface 302 of the package substrate 30 could be equipped with not only a raised layer 315 but also the cathode 311 and the anode 313. The height of the raised layer 315 is equal to that of the cathode 311 and the anode 313, which could meet the requirements for subsequent process.

Figure 9:
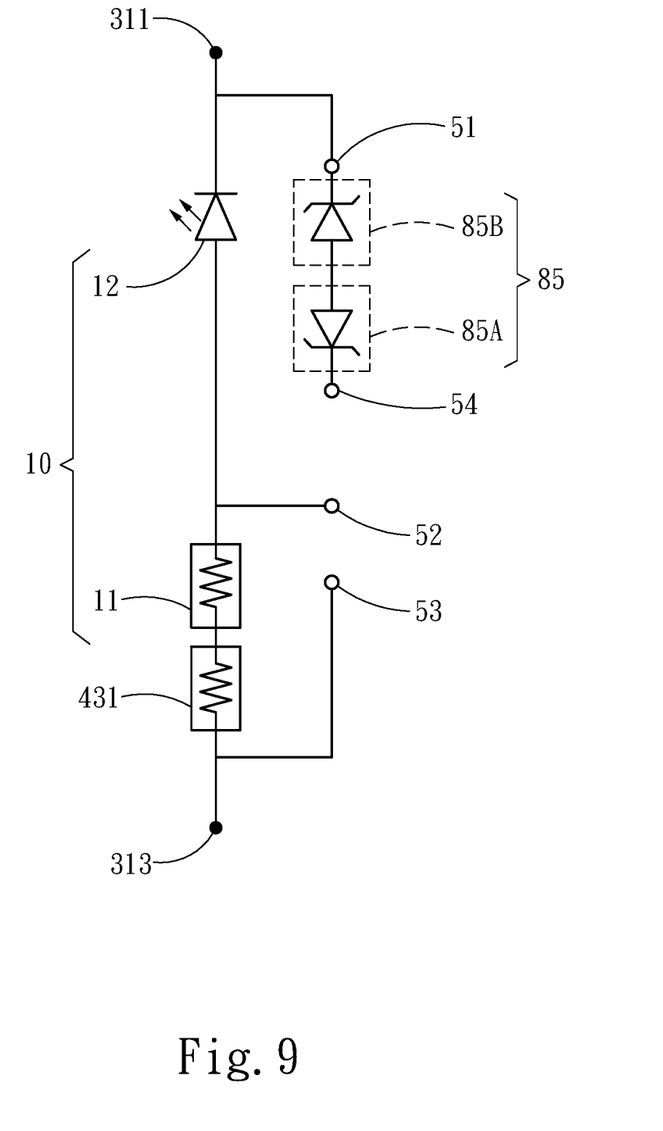
FIG. 9 is a circuit of a package structure in a second embodiment of the invention.
Figure 10:
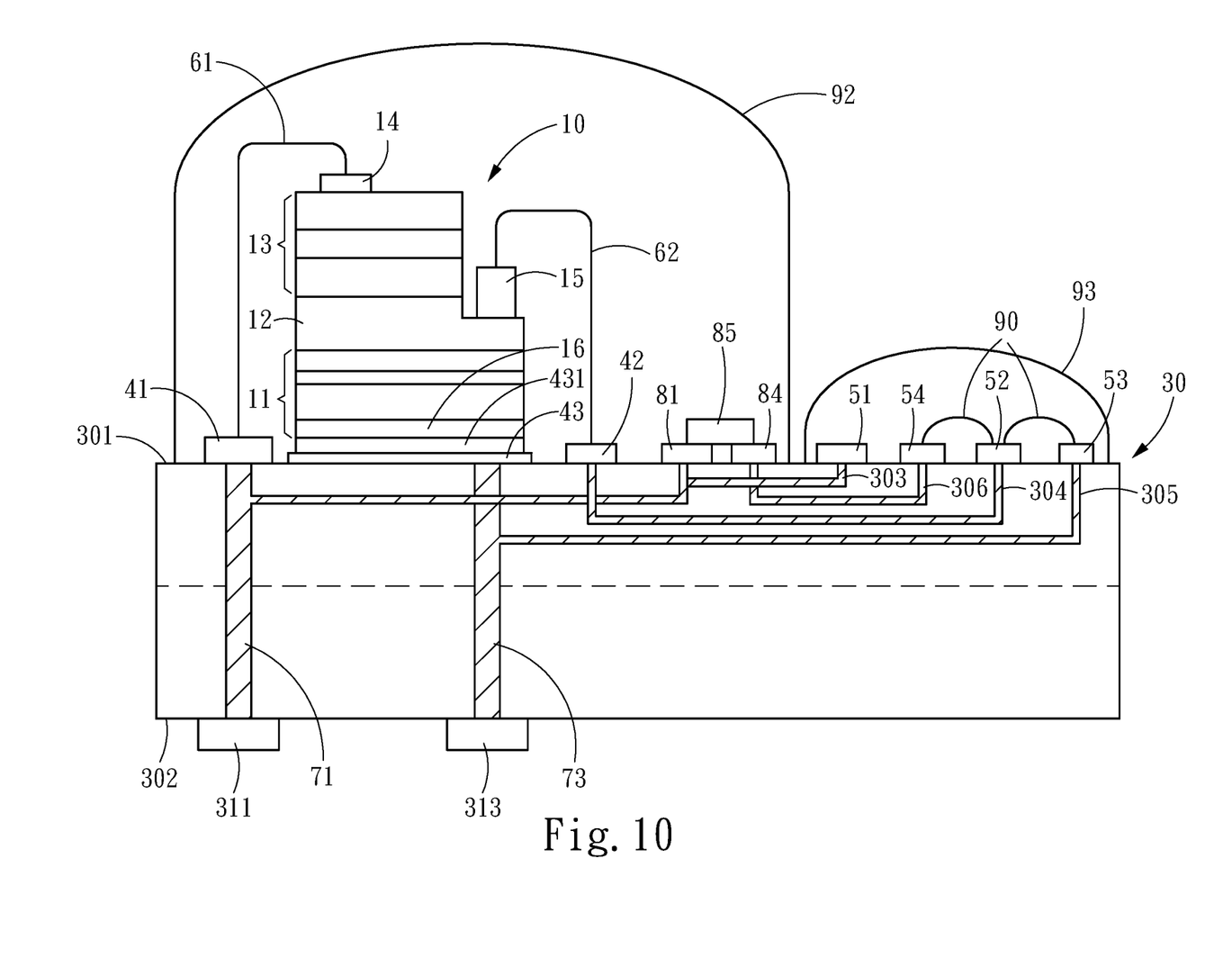
FIG. 10 is a cross section of a package structure in a second embodiment of the invention.

Please refer to FIG. 9 and FIG. 10, as a second embodiment of the invention, compared with the first embodiment, the package substrate 30 comprises a secondary first electrode 81, a secondary second electrode 84, and a fourth electrical test contact 54. The secondary first electrode 81 is electrically connected with the first electrical test contact 51, the secondary second electrode 84 is electrically connected with the fourth electrical test contact 54, and a Zener diode 85 is electrically connected between the secondary first electrode 81 and the secondary second electrode 84. In an actual implementation, the secondary first electrode 81 is electrically connected with a first electrical test contact 51 by the metal conductive layer 303, and the secondary second electrode 84 is electrically connected with the fourth electrical test contact 54 by a metal conducting layer 306.

Further, the Zener diode 85 could be Bi-directional Zener Diodes, comprising one-directional Zener diodes 85A and 85B (as drawn in FIG. 9) arranged in different directions. Or, the one-directional Zener diode 85A could be used solely, and if the Zener diode is the one-directional Zener diode 85A, the one-directional Zener diode 85A should be connected to the light emitting diode chip 10 in parallel circuit manner with opposite polarity.

In the second embodiment of the invention, the light emitting diode package structure circuit includes four test contacts, i.e., a first electrical test contact 51, a second electrical test contact 52, a third electrical test contact 53, and a fourth electrical test contact 54, as shown in FIG. 9. By selecting the first electrical test contact 51 and the fourth electrical test contact 54 to test, we can know about whether the one-directional Zener diode 85A functions properly. The second electrical test contact 52 of the electrical test and the third electrical test contact 53 of the electrical test are selected for test to obtain the electrical characteristics of the alternative substrate adhesive layer 11B and the chip-substrate bonding adhesive layer 431 between the P-type main electrode 16 and the package substrate 30.

The first electrical test contact 51 and the second electrical test contact 52 are selected for test to obtain the characteristics of a trace voltage and current of a forward biased voltage and a reverse biased voltage of the semiconductor epitaxial structure 13.

In the existence of the Zener diode 85, a low current in forward direction Vf of the light emitting diode chip 10 could be measured, and whether a leakage current of the reverse biased voltage of the light emitting diode chip 10 increases abnormally could be measured. The cause of the increase in a reverse biased leakage current is the extension of defects of the semiconductor, which could be carried out by high temperature furnace aging or an ESD test for a mechanical stress or a thermal stress in a packaging process or a product tightening test.

After the test is completed, the second electrical test contact 52, the third electrical test contact 53, and the fourth electrical test contact 54 are electrically connected through a conductive metal 90. The conductive metal 90 could be formed by the gold wire used in wire bonding process, or semiconductor thin films process.

In addition, in order to protect the element on the package substrate 30, after the test is completed, as shown in FIG. 3, the vertical light emitting diode chip package further comprises a packaging material 91. The packaging material 91 covers the upper surface 301 of the package substrate 30, thus protecting the element on the package substrate 30.

Or, as shown in FIG. 10, the vertical light emitting diode chip package further comprises a first packaging material 92 and a second packaging material 93, wherein the first packaging material 92 covers the light emitting diode chip 10, the first chip bonding wire 61, the second chip bonding wire 62, the Zener diode 85, the main first electrode 41, the main second electrode 42, the main third electrode 43, the secondary first electrode 81, and the secondary second electrode 84.

The first electrical test contact 51, the second electrical test contact 52, the third electrical test contact 53, and the fourth electrical test contact 54 that are not packaged are tested, which could solve the first chip bonding wire 61 and the second chip bonding wire 62 are pulled by the packaging material 91 (as shown in FIG. 3) or the first packaging material 92 (as shown in FIG. 10) in a packaging process. The pull may destroy the light emitting diode chip 10, so as to form a micro-crack or a film stripping, causing the problem on failure or stability.

After the test is completed, similarly, the second electrical test contact 52, the third electrical test contact 53 and the fourth electrical test contact 54 are electrically connected through the conductive metal 90. Finally, the second packaging material 93 covers the conductive metal 90, the first electrical test contact 51, the second electrical test contact 52, the third electrical test contact 53, and the fourth electrical test contact 54 to finish the packaging process completely.

Additionally, as the element malfunctions, the second packaging material 93 or the conductive metal 90 could be separately removed or disconnected, which does not damage the light emitting diode chip 10. Therefore, the detection could be conducted again to find out the cause of element failure.

Figure 11:
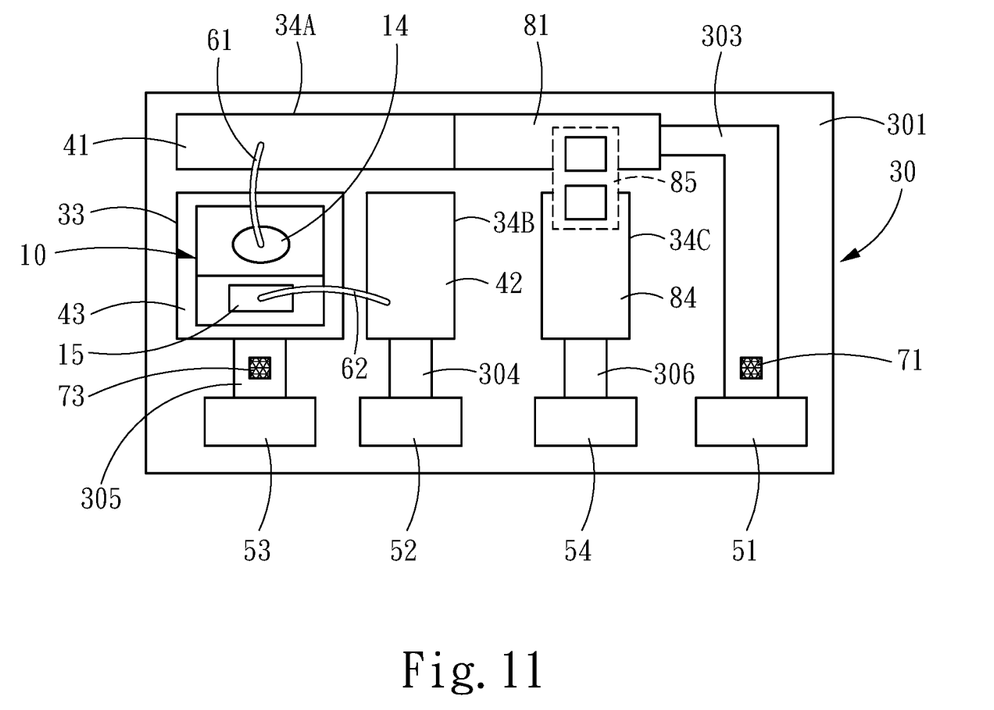
FIG. 11 is a top view of a package substrate in a second embodiment of the invention.

FIG. 11 is a top view of a package substrate in a second embodiment of the invention. Compared with FIG. 7, the fourth electrical test contact 54, the secondary first electrode 81, the secondary second electrode 84 and the Zener diode 85 are arranged, wherein the Zener diode 85 is electrically connected with the secondary first electrode 81 and the secondary second electrode 84. The secondary first electrode 81 and the main first electrode 41 are constituted by the wire bonding pad 34A. The other wire bonding pad 34B belongs to the second electrode 42. The secondary second electrode 84 is constituted by the other wire bonding pad 34C, and the secondary second electrode 84 is electrically connected with the fourth electrical test contact 54 through the metal conducting layer 306.

As stated above, the characteristics of the invention at least including:
 1. The P-type bypass detection electrode is located on the lateral extending interface structure at the interface between the semiconductor epitaxial structure and the chip conductive structure. As long as the electrical test is conducted to the P-type bypass detection electrode connected to the second electrical test contact, the electrical characteristics of the semiconductor epitaxial structure and the chip conductive structure could be measured, which achieves the accurate characteristic test of the semiconductor element to further improve the reliability of the element.
 2. The first electrical test contact, the second electrical test contact, the third electrical test contact are centrally arranged on the upper plane of the package substrate, which facilitate the convenient and accurate up-down contact measurement of a probe without affecting the characteristics of the LED element. The endpoints of a plurality of test points are connected simply and stably after the test.
 3. In the second embodiment, by adding the fourth electrical test contact, the electrical characteristics of the reversed biased voltage of the light emitting diode chip is measured under the existence of the Zener diode, and judgment may be made whether the reverse biased leakage current is provided after applying the high-temperature aging and ESD test, thus facilitating the improvement in reliability of the light emitting diode chip 10.
 4. In the second embodiment, it is possible to test whether the Zener diode functions properly to avoid the failure of the whole element due to the failure of the Zener diode.

What is claimed is:

1. A vertical light emitting diode chip package with an electrical detection device, comprising:
 a light emitting diode chip, provided with a chip conductive structure,
 a lateral extending interface structure,
 a semiconductor epitaxial structure,
 an N-type electrode and a P-type bypass detection electrode, wherein the chip conductive structure is provided with a P-type main electrode located at a lower side, the lateral extending interface structure is arranged at one side, away from the P-type electrode, of the chip conductive structure; the semiconductor epitaxial structure and the P-type bypass detection electrode are arranged on an upper plane of the lateral extending interface structure; the semiconductor epitaxial structure and the chip conductive structure achieve an Ohmic contact by virtue of the lateral extending interface structure; and the N-type electrode is arranged at one side, away from the chip conductive structure, of the semiconductor epitaxial structure; and the chip conductive structure is provided with a structural metal layer, an alternative substrate adhesive layer and a high thermal conductive alternative substrate; wherein the structural metal layer is located below the lateral extending interface structure; the high thermal conductive alternative substrate is bonded with the alternative substrate adhesive layer below the structural metal layer; and the P-type main electrode is arranged below the high thermal conductive alternative substrate; and a package substrate, provided with an upper plane and a lower plane, the lower plane of the package substrate being provided with, an anode and a cathode thereon, the upper plane of the package substrate being provided with a main first electrode, a main second electrode, a main third electrode, a first electrical test contact, a second electrical test contact and a third electrical test contact thereon; wherein the N-type electrode is electrically connected with the main first electrode by a first chip bonding wire, the P-type bypass detection electrode is electrically connected with the main second electrode by a second chip bonding wire, the P-type main electrode is electrically connected by directly bonding the main third electrode through a chip-substrate bonding adhesive layer, the first electrical test contact is electrically connected with the main first electrode and the cathode, the second electrical test contact is electrically connected with the main second electrode, and the third electrical test contact is electrically connected with the main third electrode and the anode.

2. The vertical light emitting diode chip package according to claim 1, wherein the package substrate further comprises a secondary first electrode, a secondary second electrode and a fourth electrical test contact, wherein the secondary first electrode is electrically connected with the first electrical test contact, the secondary second electrode is electrically connected with the fourth electrical test contact, and a Zener diode is electrically connected between the secondary first electrode and the secondary second electrode.

3. The vertical light emitting diode chip package according to claim 2, wherein the Zener diode is a one-directional diode and connected to the light emitting diode chip in parallel circuit manner with opposite polarity.

4. The vertical light emitting diode chip package according to claim 2, wherein the second electrical test contact, the third electrical test contact and the fourth electrical test contact are electrically connected through a conductive metal.

5. The vertical light emitting diode chip package according to claim 4, further comprising a packaging material which covers an upper plane of the package substrate.

6. The vertical light emitting diode chip package according to claim 2, further comprising a first packaging material which covers the light emitting diode chip, the first chip bonding wire, the second chip bonding wire, the Zener diode, the main first electrode, the main second electrode, the main third electrode, the secondary first electrode, and the secondary second electrode.

7. The vertical light emitting diode chip package according to claim 6, wherein the second electrical test contact, the third electrical test contact and the fourth electrical test contact are electrically connected through a conductive metal.

8. The vertical light emitting diode chip package according to claim 7, further comprising a second packaging material which covers the conductive metal, the first electrical test contact, the second electrical test contact, the third electrical test contact and the fourth electrical test contact.

9. The vertical light emitting diode chip package according to claim 1, wherein the main first electrode is electrically connected with the cathode through a first via metal of a substrate metal penetrating through the package substrate, and the main third electrode is electrically connected with the anode through a second via metal of a substrate metal penetrating through the package substrate.

10. The vertical light emitting diode chip package according to claim 1, wherein the semiconductor epitaxial structure comprises a P-type semiconductor, an active layer and an N-type semiconductor which are stacked successively, the N-type electrode being located on the N-type semiconductor, and the P-type semiconductor and the P-type bypass detection electrode are respectively located at different positions of the lateral extending interface structure.

11. The vertical light emitting diode chip package according to claim 10, wherein the lateral extending interface structure comprises a high conductive metal layer, an Ohmic contact layer and a high concentration P-type semiconductor conducting layer which are stacked successively; and the P-type bypass detection electrode is located at an outer side of an edge of the lateral extending interface structure.

12. The vertical light emitting diode chip package according to claim 11, wherein the high conductive metal layer is located above the structural metal layer, and the P-type semiconductor and the P-type bypass detection electrode are respectively located on the high concentration P-type semiconductor conductive layer.

13. The vertical light emitting diode chip package according to claim 11, wherein the high conductive metal layer is located above the structural metal layer, the P-type semiconductor is located on the high concentration P-type semiconductor conductive layer, and the P-type bypass detection electrode are respectively located on the Ohmic contact layer.

14. The vertical light emitting diode chip package according to claim 11, wherein the high conductive metal layer is located above the structural metal layer, the P-type semiconductor is located on the high concentration P-type semiconductor conductive layer, and the P-type bypass detection electrode is located on the high conductive metal layer.

15. The vertical light emitting diode chip package according to claim 11, wherein the Ohmic contact layer refers to matching an Ohmic contact metal with a transparent material, and the Ohmic contact metal is of a plurality of columnar structures.

* * * * *